United States Patent
Zhong et al.

(10) Patent No.: US 11,936,344 B2
(45) Date of Patent: Mar. 19, 2024

(54) SELF-EXCITED OSCILLATION SUPPRESSION DEVICE AND METHOD FOR THE POWER AMPLIFYING CIRCUIT

(71) Applicant: SOOCHOW UNIVERSITY, Suzhou (CN)

(72) Inventors: Bowen Zhong, Suzhou (CN); Daqian Zhang, Suzhou (CN)

(73) Assignee: SOOCHOW UNIVERSITY, Suzhou (CN)

( * ) Notice: Subject to any disclaimer, the term of this patent is extended or adjusted under 35 U.S.C. 154(b) by 381 days.

(21) Appl. No.: 17/441,025

(22) PCT Filed: Aug. 11, 2020

(86) PCT No.: PCT/CN2020/108356
§ 371 (c)(1),
(2) Date: Sep. 20, 2021

(87) PCT Pub. No.: WO2021/139153
PCT Pub. Date: Jul. 15, 2021

(65) Prior Publication Data
US 2022/0158593 A1    May 19, 2022

(30) Foreign Application Priority Data

Jan. 9, 2020  (CN) .......................... 202010020920.5

(51) Int. Cl.
*H03F 1/34* (2006.01)
*H03F 3/45* (2006.01)

(52) U.S. Cl.
CPC .................................. *H03F 1/342* (2013.01)

(58) Field of Classification Search
CPC .... H03F 1/342; H03F 1/086; H03F 2200/153; H03F 3/3022; H03F 3/45475
(Continued)

(56) References Cited

U.S. PATENT DOCUMENTS

| 7,400,191 B2 * | 7/2008 | Rodriguez .......... H03F 3/45475 330/10 |
| 9,379,679 B2 * | 6/2016 | Noro ..................... H03L 7/0812 |
| 2010/0201449 A1 | 8/2010 | Hasegawa |

FOREIGN PATENT DOCUMENTS

| CN | 205039782 U | 2/2016 |
| CN | 205666802 U | 10/2016 |

(Continued)

*Primary Examiner* — Hieu P Nguyen
(74) *Attorney, Agent, or Firm* — SZDC Law PC

(57) ABSTRACT

This invention relates to a self-excited oscillation suppression device and method for the power amplifying circuit, belonging to the field of electronic technology. Said power amplifying circuit includes a FET and a feedback loop. Said device includes: a first compensation circuit which is connected between a drain and a gate of the FET and a second compensation circuit which is connected in parallel with a feedback resistor of said feedback loop. It can solve self-excited oscillation caused by deep negative feedback in the existing power amplifying circuit. The first compensation circuit can shift the open-loop gain curve forward as a whole, and the second compensation circuit can speed up the closure of the feedback gain curve and the open-loop gain curve so that the two curves will close up before the self-excited oscillation; the self-excited oscillation will be suppressed, and the stability of the power amplifying circuit will be improved.

9 Claims, 4 Drawing Sheets

(58) Field of Classification Search
USPC .................................. 330/277, 291, 252–261
See application file for complete search history.

(56) References Cited

FOREIGN PATENT DOCUMENTS

| CN | 110233600 A | 9/2019 |
|----|-------------|--------|
| CN | 110289818 A | 9/2019 |
| CN | 111130467 A | 5/2020 |

\* cited by examiner

//www.w3.org/1999/xlink" xmlns:xlink="http://www.w3.org/1999/xlink">
SELF-EXCITED OSCILLATION SUPPRESSION DEVICE AND METHOD FOR THE POWER AMPLIFYING CIRCUIT This invention is the National Stage Application of PCT/CN2020/108356, filed on Aug. 11, 2020, which claims the priority of the Chinese invention No. 202010020920.5, filed on Jan. 9, 2020, the content of which is incorporated into this invention by reference.

TECHNICAL FIELD

This invention relates to a self-excited oscillation suppression device and method for the power amplifying circuit, which belongs to the field of electronic technology.

BACKGROUND OF THE INVENTION

Power amplifying circuit is a kind of amplifying circuit for the purpose of output higher power. Power amplifiers usually comprise multistage amplifiers. However, the multistage amplifying circuit voltage pressurization is relatively large, in the open-loop state, a small signal input will cause the amplifying circuit to produce linear distortion.

And the negative feedback amplifying circuit is to close the multistage amplifying circuit through the feedback loop, so as to reduce the voltage gain of the amplifying circuit and increase the bandwidth.

However, when the negative feedback goes deeply, the phase of the feedback signal and the phase of the input signal may be reversed due to the influence of capacitive elements in the amplifier circuit on the signal phase. At this point, when the two signals are superimposed, the negative feedback circuit will become a positive feedback circuit, causing circuit oscillation (that is, the self-excited oscillation of the amplifier circuit). When the self-oscillation phenomenon is serious, even if no signal is input, the power amplifying circuit is still unstable in closed loop, and the output ripple is relatively large. Therefore, there is an urgent need for a device and method to suppress self-oscillation to improve the stability of the power amplifying circuit.

SUMMARY OF THE INVENTION

It is therefore an object of this invention to provide a self-excited oscillation suppression device for the power amplifying circuit, which can solve the problem of self-excited oscillation caused by deep negative feedback in the existing power amplifying circuit. This invention provides the following technical solutions:

Firstly, a self-excited oscillation suppression device for the power amplifying circuit is provided, said power amplifying circuit comprises a field effect tube (FET) and a feedback loop, said device comprises:
  a first compensation circuit bonding between a drain and a gate of the FET;
  and a second compensation circuit connected in parallel with a feedback resistor of said feedback loop.

Optionally, said first compensation circuit is used to reduce the target pole frequency of said power amplifying circuit.

Optionally, said first compensation circuit comprises a first capacitor and a first resistor in series.

Optionally, said second compensation circuit is used to increase the closing velocity of the feedback gain curve of the feedback loop and the open loop gain curve of said power amplifying circuit.

Optionally, said second compensation circuit comprises a second capacitor and a second resistor in series.

Secondly, a self-excited oscillation suppression method of the power amplifying circuit is provided for said self-excited oscillation suppression device, the methods comprises:
  acquiring a frequency adjustment target of the target pole frequency for said power amplifying circuit;
  acquiring a speed adjustment target for the closing speed of the feedback gain curve from said feedback loop and the open loop gain curve from said power amplifying circuit;
  determining the first device parameters of each device in said first compensation circuit based on said frequency adjustment target;
  determining the second device parameters of each device in said second compensation circuit based on said speed adjustment target;
  using the first compensation circuit with said first device parameters and the second compensation circuit with said second device parameters to perform self-excited oscillation suppression to said power amplifying circuit.

Optionally, said first compensation circuit comprises a first capacitor and a first resistor; the first device parameters of each device in said first compensation circuit are determined based on said frequency adjustment target, the above step may comprise:
  determining the capacitance value of said first capacitor and the resistance value of said first resistor based on the target pole frequency indicated by said frequency adjustment target.

Optionally, said second compensation circuit comprises a second capacitor and a second resistor; the second device parameters of each device in said second compensation circuit are determined based on said speed adjustment target, the above step may comprise:
  determining the target slope of said feedback gain curve at the target position based on the speed adjustment target;
  determining the capacitance value of said second capacitor and the resistance value of said second resistor based on the target slope and the pole frequency of said target position.

Optionally, said self-excited oscillation suppression method may also comprise:
  determining whether the amplification series of the power amplifying circuit is greater than 1,
  triggering execution of a step to acquiring the frequency adjustment target for the target pole frequency of said power amplifying circuit when the amplification series of the power amplifying circuit is greater than 1.

The beneficial effects of this invention are:
the first compensation circuit is connected across the drain and the gate of the FET of the power amplifying circuit, and the second compensation circuit is connected in parallel with the two ends of the feedback resistor in the feedback loop. It can solve the self-excited oscillation caused by the deep negative feedback of the existing power amplifying circuit. The first compensation circuit can shift the open-loop gain curve forward as a whole, meanwhile, the second compensation circuit can speed up the closure of the feedback gain curve and the open-loop gain curve, so that the above two curves will close up before the self-excited oscillation; the self-excited oscillation will be suppressed, and the stability of the power amplifying circuit will be improved.

The foregoing explanation is only an overview of the technical scheme of this invention. In order to better understand the technical means of this invention and implement it under the specification's content, the following is a better implementation example of this invention together with the attached drawings for the detailed explanation.

EMBODIMENTS

Below are further described the specific implementation way of the present invention in conjunction with the drawings and examples. The following embodiments are used to clarify this invention but shall not limit the scope of this invention.

Figure 1:
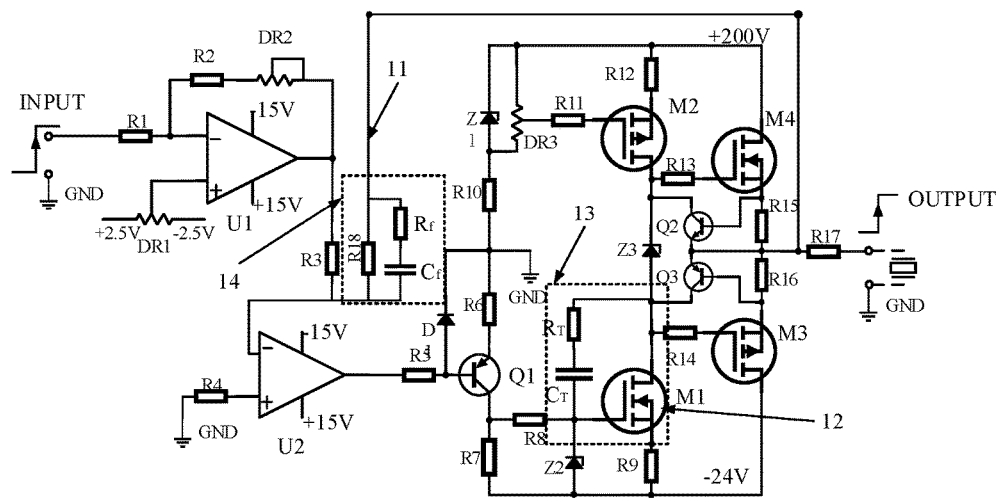
FIG. 1 is a schematic structural diagram of a self-excited oscillation suppression device of a power amplifying circuit according to an embodiment of the present application.

FIG. 1 is a schematic structural diagram of a self-oscillation suppression device of a power amplifying circuit. As shown in FIG. 1, the power amplifying circuit consists of an n-stage amplifying circuit and a feedback loop (11), wherein n is an integer greater than 1.

Optionally, the n-stage amplifier circuit comprises at least a one-stage amplifying circuit containing a FET (12).

The self-excited oscillation suppression device of a power amplifying circuit comprises a first compensation circuit which is connected between the drain and the gate of the FET (12), and a second compensation circuit (14) which is connected in parallel with a feedback resistor (R18) of said feedback loop (11).

As shown in FIG. 1, a specific embodiment is given below. According to the sequence from the signal input terminal to the signal output terminal, the power amplifying circuit comprises: a first operational amplifier (U1), a second operational amplifier, triode (Q1), a first FET (M1), a second FET (M2), a third FET (M3), a fourth FET (M4), and a feedback loop (11) consisting of the feedback resistors (R18).

In the above power amplifying circuit, the output terminal of the first operational amplifier (U1) is connected to the inverting input terminal of the second operational amplifier (U2) through the resistor (R3). The output terminal of the first operational amplifier (U1) can also be connected to the inverting input terminal of the first operational amplifier (U1) through at least one resistor. The feedback loop (11) is connected between the resistor (R3) and the inverting input of the second operational amplifier (U2) through the output of the power amplifying circuit. The second compensation circuit (14) is connected in parallel with the feedback resistor (R18) in the feedback loop (11).

The second operational amplifier (U2) output is connected to the triode (Q1) base. The triode (Q1) collector is connected to the first FET (M1) gate through the gate resistor (R8), and is connected to the first FET (M1) source through the collector resistance (R7), respectively. The first compensation circuit (13) connects the gate and drain of the first FET (M1). The triode Q1 emitter is grounded.

The second FET (M2) drain is connected to the first FET (M1) drain, the second FET (M2) gate is grounded. The second FET (M2) source is connected to the ground and the fourth FET (M4) drain respectively through the resistor (R12). The second FET (M2) drain is also connected to t the fourth FET (M4) gate.

The connection mode of the third FET (M3) is symmetric with that of the fourth FET (M4), and the difference is that: the third FET (M3) gate is connected to the first FET (M1) drain, the third FET (M3) drain is connected to the first FET (M1) source through the source resistor (R9) of the first FET (M1).

Moreover, the third FET (M3) source is connected to the fourth FET (M4) source, and the output terminal of the power amplifier circuit is introduced between the third FET (M3) source and the fourth FET (M4) source. It should be noted that the power amplifying circuit can also comprise more devices, for example, (R1), (R2), (DR1), (DR2), etc., in FIG. 1; this embodiment will not be described one by one herein. In addition, the power amplifying circuit shown in FIG. 1 is only schematic, and this embodiment does not limit the implementation of the power amplifying circuit.

Figure 2:
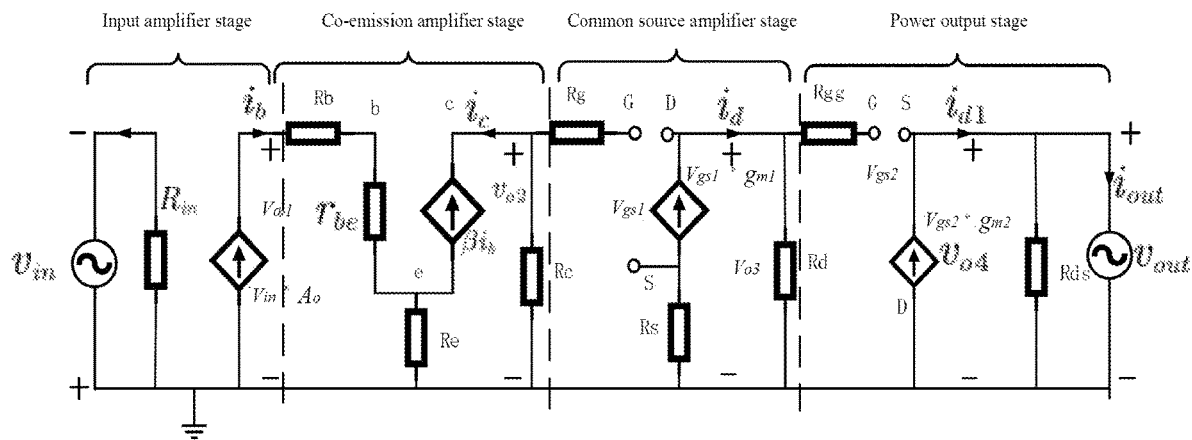
FIG. 2 is a schematic diagram of the low-frequency equivalent circuit of a power amplifying circuit provided in one embodiment of the present invention.

According to the power amplifying circuit in FIG. 1 and the low-frequency equivalent circuit of the power amplifying circuit in FIG. 2. It can be seen from FIG. 2 that the low-frequency equivalent circuit of the power amplifying circuit is an open-loop form including a four-stage amplifying circuit. At low frequencies, the voltage gain of the multi-stage amplifying circuit is equal to the product of the voltage gains from the various amplifying circuit. In order to obtain its voltage gain, the voltage gain of each amplifying circuit stage needs to be calculated. The voltage gain of each amplifying circuit stage is the ratio of the output voltage to the input voltage of the amplifying circuit in that stage.

Figure 3:
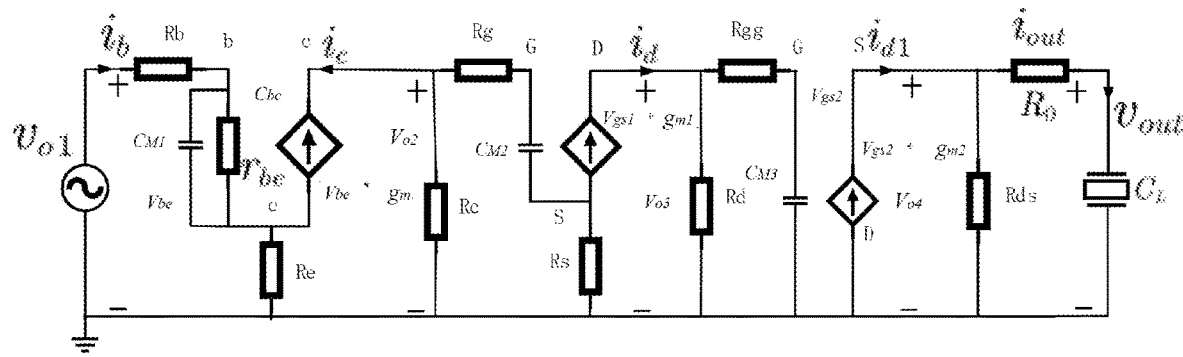
FIG. 3 is a schematic diagram of the high-frequency equivalent circuit of a power amplifying circuit provided in one embodiment of the present invention.

According to the power amplifying circuit in FIG. 1 and the high-frequency equivalent circuit of the power amplifying circuit in FIG. 3. The inter-electrode capacitance of the power tubes in each stage only affects the input terminals of the circuits in that stage. Considering the frequency poles brought by the load, the open-loop amplifying circuit mainly has four pole frequencies. Since the input terminal of each amplifying circuit stage is equivalent to a first-order low-pass circuit, the pole frequency of each amplifying circuit stage can be calculated according to the cut-off frequency of the low-pass circuit. The steps to calculate the pole frequency in each amplifying circuit stage comprise: calculating the resistance value of the input resistor in that stage; calculating capacitance value of the equivalent capacitance in that stage, obtaining the corresponding pole frequency with the following cut-off frequency calculation equation. The cut-off frequency calculation equation is as follows:

$$f = \frac{1}{2\pi \cdot RC}$$

Among them, R is the resistance value of the input resistor in that stage; C is the capacitance value of the equivalent capacitance in that stage; the value of R and C can be calculated through the high-frequency equivalent circuit in FIG. 3.

Figure 4:
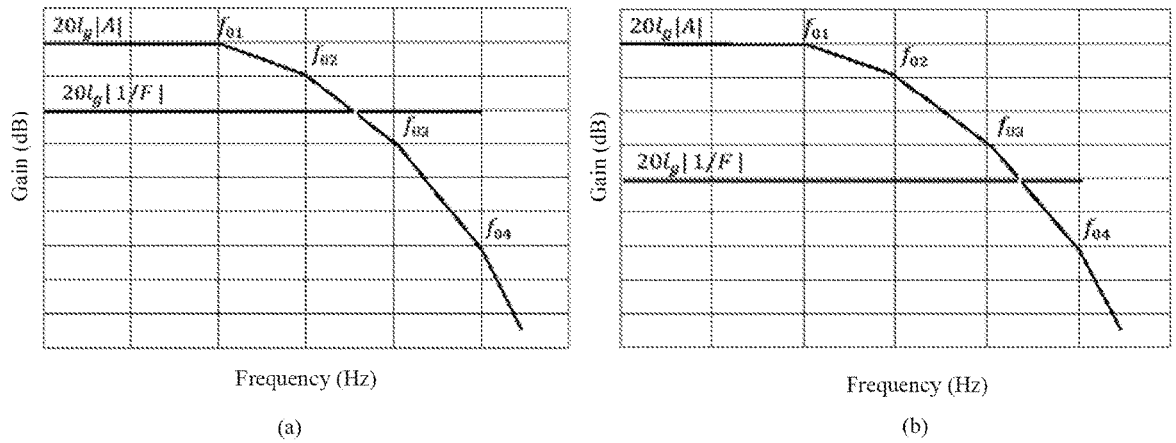
FIG. 4 shows two intersections of the open-loop gain curve (the curve) and the feedback gain curve (the line) of a power amplifying circuit provided in one embodiment of the present invention.

Consider the intersection of the open-loop gain curve (curve) and the feedback gain curve (straight line) from the power amplifying circuit in FIG. 4, (a) shows the case where the amplifying circuit is not self-excited. However, in the implementation, in order to obtain a larger bandwidth for the deep negative feedback circuit, the feedback coefficient F is usually increased to make the feedback line move down, which will cause self-excited oscillation. So that, the loop curve in FIG. 4 (b) appears for the deep negative feedback amplifying circuit.

In order to avoid self-excited oscillation of the power amplifying circuit, it is necessary to ensure that the open-loop gain curve and the feedback gain curve in FIG. 4 (b) intersect at the closed slope of 40 dB/dec, but not at the cost of bandwidth reduction. Therefore, the power amplifying circuit needs to take frequency compensation measures to suppress self-excited oscillation under the premise of ensuring the low-frequency gain and bandwidth of the amplifying circuit.

In the present invention, by adding the first compensation circuit, the capacitance value of the equivalent capacitor $C_{M2}$ and the resistance value of the input resistor R2 in FIG. 3 can be increased, thus the frequency of the pole frequency f02 is reduced. Please refer to FIG. 5, at this point, the pole frequency $f_{o2}$ meets the point fp to make the overall open-loop gain curve moves forward to accelerate the intersecting speed with the feedback gain curve.

In addition, by adding a second compensation circuit, the feedback gain curve of the power amplifying circuit can be changed, that is, by adding an inflection point (or pole) $f_{p0}$ to the feedback gain curve, the curve after the inflection point will close up with the open-loop gain curve at a desired speed.

The feedback gain curve after adding the second compensation circuit can be calculated through the following equation:

$$F(s) = \frac{(R_f + R_{18})C_f S + 1}{R_{19}(1 + R_f C_f S)}$$

Wherein $R_f$ is the resistance value of the second resistor, $C_f$ is the capacitance value of the second capacitor, and $S=j\omega$.

The pole $f_{p0}$ can be calculated by the following equation:

$$f_{p0} = \frac{1}{2\pi(R_f + R_{18})C_f}$$

In summary, the self-excited oscillation suppression device of the power amplifying circuit provided by the present invention, by connecting the first compensation circuit crosses the drain and the gate of the FET, and connecting the second compensation circuit in parallel with both ends of the feedback resistor in the feedback loop. It can solve the problem of self-excited oscillation caused by deep negative feedback in the existing power amplifying circuit. The first compensation circuit can move forward the overall open loop gain curve, and second compensation circuit can accelerate the closure of the feedback gain curve and the open-loop gain curve, so that the above two curves will close up before the self-excited oscillation. Thus the self-excited oscillation will be suppressed, and the stability of the power amplifying circuit will be improved.

Figure 6:
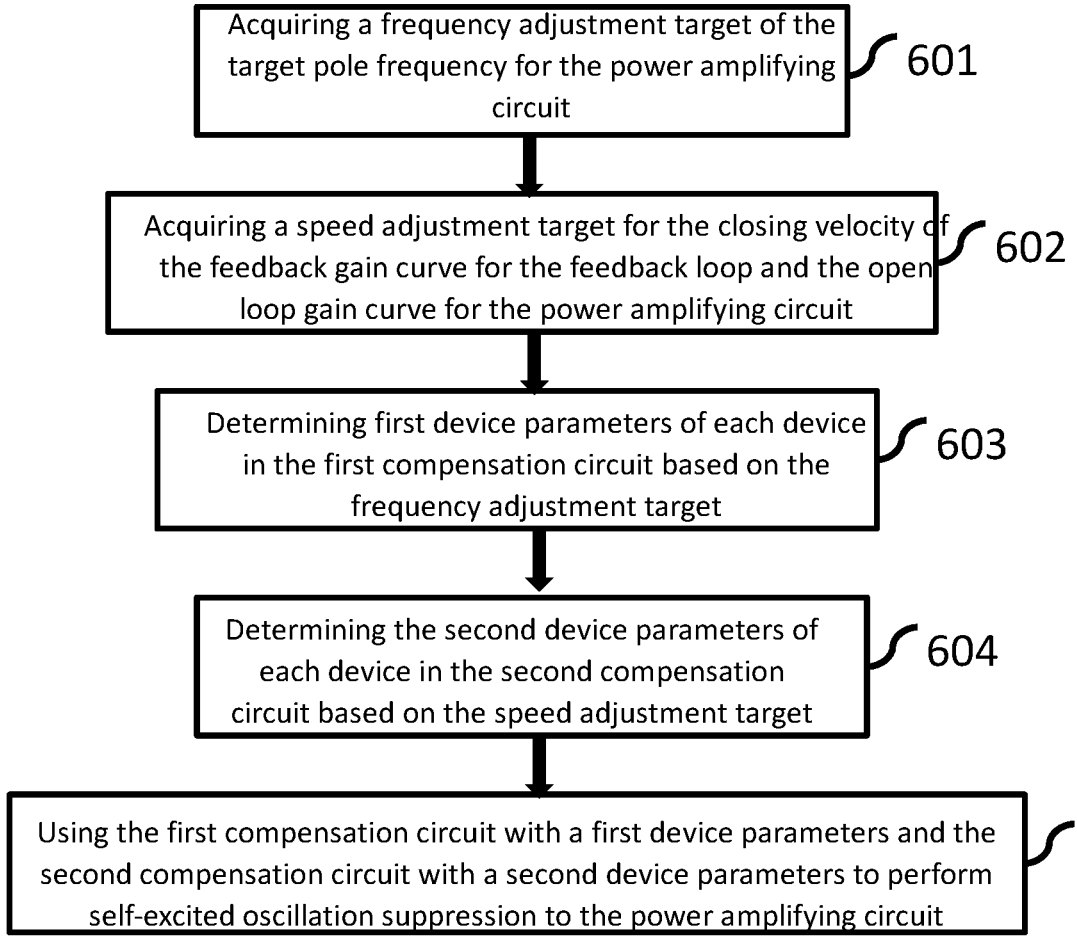
FIG. 6 is a flowchart of a self-excited oscillation suppression method for a power amplifying circuit provided in one embodiment of the present invention.

FIG. 6 is a flowchart of a self-excited oscillation suppression method for a power amplifying circuit provided in one embodiment of the present invention. This embodiment is illustrated by the application of the method to the self-excited oscillation suppression device of the power amplifier circuit shown in FIG. 1. The method consists of at least the following steps:

Step 601, acquiring a frequency adjustment target of the target pole frequency for the power amplifying circuit.

Optionally, step 601 may further comprise:
determining the Bode diagram of the power amplifying circuit;
determining the adjusted position of the target pole frequency through the target pole frequency of the amplifying circuit where the target FET is located in the Bode diagram;
generating a frequency adjustment target for indicating the adjusted position of the target pole frequency.

Figure 5:
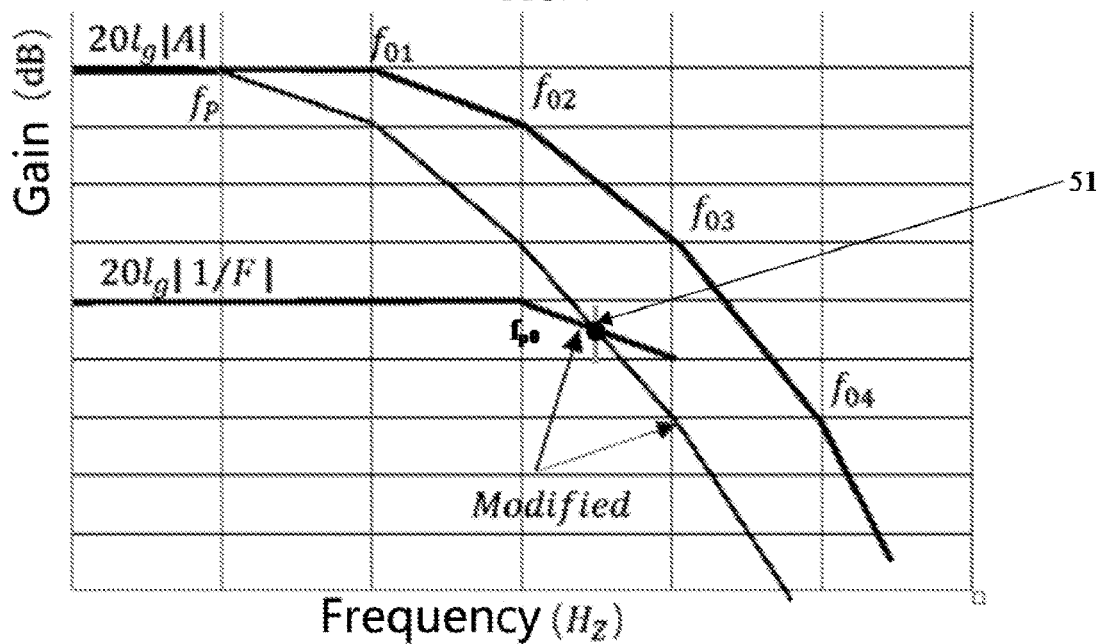
FIG. 5 is a schematic diagram of the open-loop gain curve and the feedback gain curve of the compensated power amplifying circuit provided in one embodiment of the present invention.

Here is an example in FIG. 5, if the pole frequency 1'02 (target pole frequency) moves to the point $f_p$, then $f_p$ is the frequency position indicated by the frequency adjustment target.

Step 602, acquiring a speed adjustment target for the closing velocity of the feedback gain curve from the feedback loop and the open-loop gain curve from the power amplifying circuit.

Optionally, step 602 may further comprise:
determining the Bode diagram of the power amplifying circuit;
determining the speed adjustment target based on the expected intersection of the feedback gain curve and the open-loop gain curve in the Bode diagram.

Take point 51 as the expected intersection point of the feedback gain curve and the open-loop gain curve for example in FIG. 5. To achieve this, an inflection point (or pole) $f_{p0}$ is added to the feedback gain curve, thus the curve after the inflection point will close up with the open-loop gain curve at a desired speed to make the two curves intersect at point 51.

Step 603, determining the first device parameters of each device in the first compensation circuit based on the frequency adjustment target.

The first compensation circuit comprises a first capacitor and a first resistor.

Step 603 may further comprise: determining the capacitance value of the first capacitor and the resistance value of said first resistor based on the target pole frequency indicated by the frequency adjustment target.

Specifically, step 603 may also comprise:
determining the high-frequency equivalent circuit of the power amplifying circuit;
determining the equivalent capacitance corresponding to the target FET and the input resistor of the amplifying circuit where the target FET is located;
determining the capacitance value of the equivalent capacitor and the resistance value of the input resistor based on the target pole frequency indicated by the frequency adjustment target;
determining the capacitance value of the first capacitor according to the capacitance value of the equivalent capacitor;
determining the resistance value of the first resistor according to the resistance value of the input resistor.

Step 604, determining the second device parameters of each device in the second compensation circuit based on the speed adjustment target.

The second compensation circuit comprises a second capacitor and a second resistor. Step 604 may further comprises:

determining the target slope of the feedback gain curve at the target position based on the speed adjustment target;

determining the capacitance value of the second capacitor and the resistance value of the second resistor based on the target slope and the pole frequency of the target position.

Specifically, step 604 may also comprise:

determining the capacitance value of the second capacitor and the resistance value of the second resistor by taking the target slope as the derivative of the feedback gain curve at the target position, and the target position frequency as the pole frequency.

Here is an example: by taking the derivative of the expression of the feedback gain curve at the target location (inflection point) after adding the second compensation circuit, and the derivation result is to be the target slope, the relationship between the target slope, the second capacitor capacitance value and the second resistor resistance value in the derivation formula can be determined; furthermore, by taking the pole frequency of the target location as the result of the expression of pole $f_{p0}$, the relationship between the pole frequency, the second capacitor capacitance value, and the second resistor resistance value in the calculation formula of the pole frequency can be determined; finally, according to the two above relationships, the second resistor resistance value and the second capacitor capacitance value can be determined.

Step 605, using the first compensation circuit with the first device parameters and the second compensation circuit with the second device parameters to perform self-excited oscillation suppression to the power amplifying circuit.

Optionally, since the power amplifying circuit with deep negative feedback has a higher probability of self-excited oscillation, it is necessary to determine whether the amplifier series of the power amplifying circuit is greater than 1 before step 601. Trigger the step of obtaining the frequency adjustment target of the target pole frequency of the power amplifying circuit, when the amplifier series of the power amplifying circuit is greater than 1. End the process when the amplifier series is equal to 1.

In summary, the self-excited oscillation suppression method of the power amplifying circuit provided in the present embodiment can solve the problem of self-excited oscillation caused by the deep negative feedback of the existing power amplifying circuit through the follow measures: connecting the first compensation circuit between the drain and the gate of the FET of the power amplifying circuit; connecting the second compensation circuit in parallel with the two ends of the feedback resistor in the feedback loop.

Since the first compensation circuit can move the open-loop gain curve forward as a whole, and the second compensation circuit can speed up the closure of the feedback gain curve and the open-loop gain curve, the open-loop gain curve and feedback gain curve will close up before the self-excited oscillation occurs, thereby suppressing the self-excited oscillation phenomenon and improving the stability of the power amplifying circuit.

Figure 7:
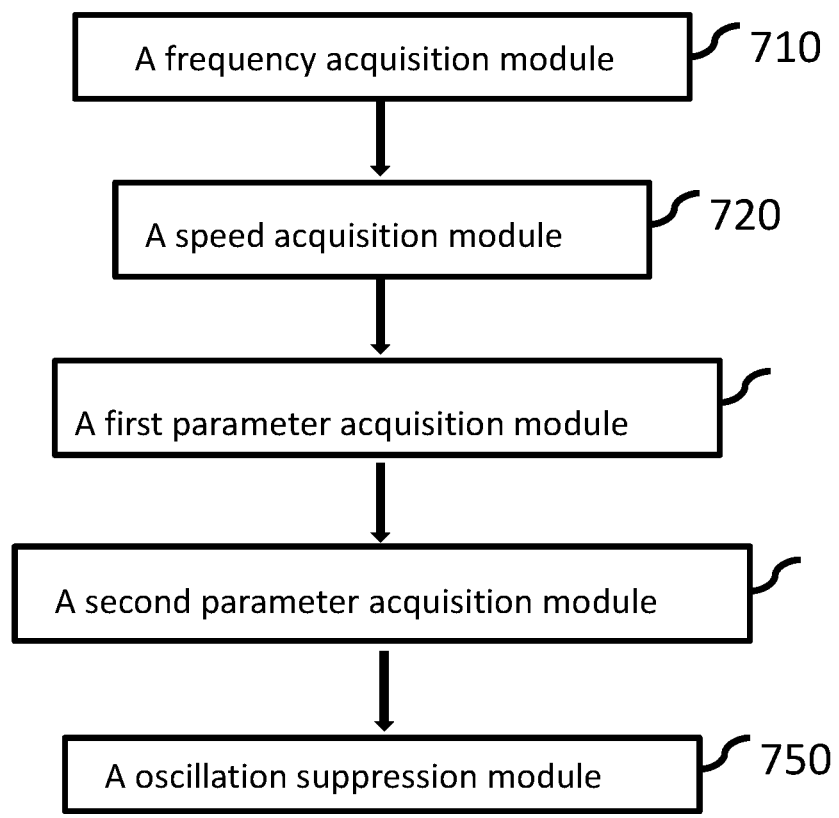
FIG. 7 is a block diagram of a self-excited oscillation suppressor for a power amplifying circuit provided in one embodiment of the present invention.

FIG. 7 is a block diagram of a self-excited oscillation suppressor for a power amplifying circuit provided in one embodiment of the present invention.

This embodiment is illustrated by the application of the device in the self-excited oscillation suppression device of the power amplifying circuit shown in FIG. 1. The present device comprises at least the following modules: a frequency acquisition module (710), a speed acquisition module (720), a first parameter acquisition module (730), a second parameter acquisition module (740) and an oscillation suppression module (750).

A frequency acquisition module (710) is used to obtain a frequency adjustment target of the target pole frequency from the power amplifying circuit.

A speed acquisition module (720) is used to obtain the speed adjustment target of the closing speed of the feedback gain curve from the feedback loop and the open-loop gain curve from the power amplifying circuit.

A first parameter acquisition module (730) is used to determine the first device parameters for each device in the first compensation circuit based on the frequency adjustment target.

A second parameter acquisition module (740) is used to determine the second device parameters for each device in the second compensation circuit based on the speed adjustment target.

An oscillation suppression module (750) is used to perform self-excited oscillation suppression to the power amplifying circuit by using the first compensation circuit with the first device parameters and the second compensation circuit with the second device parameters Refer to the above method embodiments for details. It is important to point out that:

When the self-excited oscillation suppression device of the power amplifying circuit provided in the foregoing embodiment performs the self-excited oscillation suppression to the power amplifying circuit, the division of each function module mentioned above is only used as an example to illustrate.

In practical applications, the above functions can be assigned to different functional modules according to needs, that is the internal structure of the self-excited oscillation suppression device of the power amplifying circuit is divided into different functional modules to complete all or part of the functions described above. In addition, the self-excited oscillation suppression device and the self-excited oscillation suppression method of the power amplifying circuit provided by the foregoing embodiments belong to the same idea, the specific implementation process is detailed in the method embodiments and will not be repeated here.

The technical features of the foregoing embodiments may be combined arbitrarily. For the sake of brevity, all possible combinations of the technical features of the foregoing embodiments are not described. However, as long as there is no contradiction in the combinations of these technical features, all shall be considered to be within the scope of this specification. The foregoing description has been made on several embodiments of this invention which are relatively specific and detailed, however the invention is not limited thereto. It should be further understood by those skilled in the art that various changes and modifications may be made without departing from the spirit of the invention are protected by this invention. Therefore, the scope of protection for this invention shall be subject to the appended claims.

What is claimed is:

1. A self-excited oscillation suppression device for the power amplifying circuit, is characterized in that: said power amplifying circuit comprises a FET and a feedback loop; said device comprises:

a first compensation circuit which is connected between a drain and a gate of the FET, a second compensation circuit which is connected in parallel with a feedback resistor of said feedback loop.

2. A self-excited oscillation suppression device according to claim 1, is characterized in that: said first compensation circuit is used to reduce the target pole frequency of said power amplifying circuit.

3. A self-excited oscillation suppression device according to claim 2, is characterized in that: said first compensation circuit comprises a first capacitor and a first resistor in series.

4. A self-excited oscillation suppression device according to claim 1, is characterized in that: said second compensation circuit is used to speed up the closing speed of the feedback gain curve from the feedback loop and the open-loop gain curve from said power amplifying circuit.

5. A self-excited oscillation suppression device according to claim 4, is characterized in that: said second compensation circuit comprises a second capacitor and a second resistor in series.

6. A self-excited oscillation suppression method for the power amplifying circuit, is characterized in that: said method can be used in said self-excited oscillation suppression devices for the power amplifying circuits in claim 1, said method comprises:

acquiring a frequency adjustment target of the target pole frequency from said power amplifying circuit, acquiring a speed adjustment target for the closing speed of the feedback gain curve from said feedback loop and the open-loop gain curve from said power amplifying circuit, determining the first device parameter of each device in said first compensation circuit based on said frequency adjustment target, determining the second device parameter of each device in said second compensation circuit based on said speed adjustment target, using the first compensation circuit with said first device parameters and the second compensation circuit with said second device parameters to perform self-excited oscillation suppression to said power amplifying circuit.

7. A self-excited oscillation suppression method according to claim 6, is characterized in that: said first compensation circuit comprises a first capacitor and a first resistor, the first device parameters of each device in said first compensation circuit are determined based on said frequency adjustment target, said method comprises:

determining the capacitance value of said first capacitor and the resistance value of said first resistor based on the target pole frequency indicated by said frequency adjustment target.

8. A self-excited oscillation suppression method according to claim 6, is characterized in that: said second compensation circuit comprises a second capacitor and a second resistor, the second device parameters of each device in said second compensation circuit are determined based on said speed adjustment target, said method comprises:

determining the target slope of said feedback gain curve at the target position based on said speed adjustment target;

determining the capacitance value of said second capacitor and the resistance value of said second resistor based on the target slope and the pole frequency of said target position.

9. A self-excited oscillation suppression method according to claim 6, is characterized in that: said method also comprises:

determining whether the amplification series of the power amplifying circuit is greater than 1;

triggering execution of a step to acquiring the frequency adjustment target for the target pole frequency of said power amplifying circuit when the amplification series of the power amplifying circuit is greater than 1.

\* \* \* \* \*